United States Patent [19]
Hayashi

[11] Patent Number: 5,536,934
[45] Date of Patent: Jul. 16, 1996

[54] LIGHT INTENSITY DETERIORATION DETECTING CIRCUIT WITH COMPENSATION FOR RESISTANCE ERRORS

[75] Inventor: Yutaka Hayashi, Sagamihara, Japan

[73] Assignee: Mitsubishi Denki Kabushiki Kaisha, Tokyo, Japan

[21] Appl. No.: 357,273

[22] Filed: Dec. 13, 1994

[30] Foreign Application Priority Data

Dec. 20, 1993 [JP] Japan ..................................... 5-319785

[51] Int. Cl.$^6$ .................................................. H01J 40/14
[52] U.S. Cl. ........................... 250/214.1; 372/89; 327/514
[58] Field of Search ............................. 250/214 R, 214.1, 250/551, 214 C; 327/514, 509; 372/89

[56] References Cited

U.S. PATENT DOCUMENTS

| | | | |
|---|---|---|---|
| 4,096,382 | 6/1978 | Numata et al. | 250/214 C |
| 4,819,241 | 4/1989 | Nagano | 327/514 |
| 4,995,105 | 2/1991 | Wechsler | 372/38 |
| 5,163,063 | 11/1992 | Yoshikawa et al. | 372/38 |
| 5,285,464 | 2/1994 | Ogino | 372/38 |
| 5,309,269 | 5/1994 | Shibao | 372/38 |

*Primary Examiner*—Edward P. Westin
*Assistant Examiner*—Steven L. Nichols
*Attorney, Agent, or Firm*—Oblon, Spivak, McClelland, Maier & Neustadt

[57] ABSTRACT

A light intensity deterioration detecting circuit which includes a photodiode which receives light from a laser diode and having a cathode connected to a power supply and an anode connected to a first end of a resistor. A reference current source is connected between the power supply and a first input of a comparator which has the first input connected to a first end of a resistor and a second input connected to the first end of the resistor, and which compares a comparison voltage provided at the first end of the resistor and a comparison voltage provided at the second end of the resistor to output an output voltage on the basis of the comparison result. Errors of a resistance ratio are reduced to a negligible level if relatively large errors are produced in individual resistances, thus correctly detecting deterioration of a current to light output characteristic of the laser diode without an offset control.

13 Claims, 11 Drawing Sheets

LIGHT INTENSITY DETERIORATION DETECTING CIRCUIT WITH COMPENSATION FOR RESISTANCE ERRORS

BACKGROUND OF THE INVENTION

1. Field of the Invention

The present invention relates to a light intensity deterioration detecting circuit for detecting deterioration of the light intensity of a light emitting means such as a light emitter.

2. Description of the Background Art

FIG. 13 is a circuit diagram of a conventional light intensity deterioration detecting circuit. As shown in FIG. 13, the anode of a laser diode 1 serving as a light emitter is connected to a power supply 13, and the cathode of a photodiode 2 serving as a photodetector is connected to the power supply 13. The cathode of the laser diode 1 is connected to a ground terminal 15 through a reference current source 4 and is connected to the output of a current amplifier circuit 3. The anode of the photodiode 2 is connected to a first end of a resistor 9.

The input of the current amplifier circuit 3 is connected to a second end of the resistor 9 and to the collector of an NPN bipolar transistor 6. The NPN bipolar transistor 6 has an emitter connected to the ground terminal 15 through a reference current source 5, and a base connected to the ground terminal 15 through a reference voltage source 7.

The above-mentioned laser diode 1, photodiode 2, current amplifier circuit 3, reference current source 4, reference current source 5, NPN bipolar transistor 6, reference voltage source 7, and resistor 9 form an APC (Automatic Power Control) circuit.

A comparator 11 compares a comparison voltage V91 provided at the first end of the resistor 9 and a comparison voltage V92 provided at the second end thereof to output the comparison result to an output terminal 12.

Operation of the light intensity deterioration detecting circuit shown in FIG. 13 will be described below.

A drive current $I_{LD}$ flows in the laser diode 1 which then emits light having an intensity based on the drive current $I_{LD}$. The amount of the drive current $I_{LD}$ is determined by subtracting an output current $I_{OUT}$ of the current amplifier circuit 3 from a reference current I4 of the reference current source 4.

The light emitted from the laser diode 1 is received by the photodiode 2, and a detection current $I_{PD}$ flows in the resistor 9 on the basis of the intensity of the received light.

A reference potential difference ΔVR for the comparator 11 is previously set, and the comparator 11 compares a potential difference ΔV12 between the comparison voltage V91 and the comparison voltage V92 with the reference potential difference ΔVR to output the comparison result to the output terminal 12.

When a current to light output characteristic of the laser diode 1 is satisfactory, the detection current $I_{PD}$ increases and the potential difference ΔV12 between the comparison voltages V91 and V92 is greater than the reference potential difference ΔVR. When the current to light output characteristic is deteriorated, the detection voltage $I_{PD}$ decreases and the potential difference ΔV12 is less than the reference potential difference ΔVR.

Thus, the comparator 11 detects the potential difference ΔV12 between the comparison voltages V91 and V92, compares the potential difference ΔV12 with the reference potential difference ΔVR, and outputs the comparison result, thereby to detect deterioration of the current to light output characteristic of the laser diode 1.

The conventional light intensity deterioration detecting circuit as above constructed detects the voltage across the resistor 9 to detect deterioration of the current to light output characteristic of the light emitter.

This causes the absolute accuracy errors of the resistance of the resistor 9 to be directly reflected as errors of the judgement reference of the comparator 11. For example, ±20% resistance variation of the resistor 9 when fabricated results in 20% variation in potential difference ΔV12 across the resistor 9 if the detection current $I_{PD}$ is the same.

For this reason, it has been difficult to correctly judge the deterioration of the current to light output characteristic of the light emitter. To solve the problem, it has been necessary to provide an offset control for correcting the judgement reference errors of the comparator 11 resulting from the resistance errors of the resistor 9.

SUMMARY OF THE INVENTION

The present invention is intended for a light intensity deterioration detecting circuit for detecting a light intensity deteriorated state in which a current to light output characteristic of light emitting means is deteriorated. According to the present invention, the light intensity deterioration detecting circuit comprises: photoelectric conversion means receiving light from the light emitting means for supplying a detection current based on the intensity of the received light; reference current supply means for supplying a predetermined reference current; a first resistor having first and second ends and adapted so that the detection current flows from the first end to the second end thereof; a second resistor having first and second ends and adapted so that the predetermined reference current flows from the first end to the second end thereof; and voltage comparing means for comparing a first voltage drop generated by the flow of the detection current across the first resistor and a second voltage drop generated by the flow of the predetermined reference current across the second resistor with each other to provide an output signal on the basis of the comparison result.

As above described, the light intensity deterioration detecting circuit of the present invention comprises the first resistor adapted so that the detection current flows from the first end to the second end thereof, the second resistor adapted so that the predetermined reference current flows from the first end to the second end thereof, and the voltage comparing means for comparing the first voltage drop generated by the flow of the detection current across the first resistor and the second voltage drop generated by the flow of the predetermined reference current across the second resistor to provide the output signal on the basis of the comparison result.

The reference current and the resistances of the first and second resistors are set such that the greater of the first and second voltage drops in the normal state of the light emitting means is different from that in the light intensity deteriorated state thereof, whereby the light intensity deterioration of the light emitting means is detected from the output signal of the voltage comparing means.

The detection accuracy of the light intensity deterioration by the output signal of the voltage comparing means is lowered in proportion to the errors made by the resistance ratio of the first resistor to the second resistor. The errors in the resistance ratio of the first resistor to the second resistor is reduced to a negligible level by fabricating the first and second resistors in the same process step if the respective resistances of the first and second resistors have relatively large errors. Thus the deterioration of the current to light output characteristic of the light emitting means is correctly detected without an offset control.

In another aspect of the present invention, the light intensity deterioration detecting circuit comprises: photoelectric conversion means receiving light from the light emitting means for supplying a detection current based on the intensity of the received light; reference current supply means for supplying a predetermined reference current; and voltage comparing means for comparing the detection current with the predetermined reference current in current amount to provide an output signal on the basis of the comparison result.

The current comparing means of the light intensity deterioration detecting circuit of the second aspect of the present invention compares the detection current with the predetermined reference current in current amount to output the output signal on the basis of the comparison result.

The value of the predetermined reference current is set such that the greater of the detection current and the predetermined reference current in the normal state of the light emitting means is different from that in the light intensity deteriorated state thereof, whereby the light intensity deterioration of the light emitting means is detected from the output signal of the current comparing means.

Further, since the current comparing means detects the light intensity deterioration of the light emitting means without using resistors, the deterioration of the current to light output characteristic of the light emitting means is correctly detected without offset control.

In still another aspect of the present invention, the light intensity deterioration detecting circuit comprises: photoelectric conversion means receiving light from the light emitting means for supplying a first detection current based on the intensity of the received light; first reference current supply means for supplying a first reference current having the amount of the first detection current assumed when the light emitting means is normal; second reference current supply means for supplying a second reference current; a transistor having a first electrode receiving the first detection current, a second electrode connected to the first reference current supply means, and a control electrode, the transistor being saturated to supply a control current from the control electrode to the second electrode when the first detection current is less than the first reference current; detection current supply means for supplying a second detection current having an amount based on the amount of the control current; a first resistor having first and second ends and adapted so that the second detection current flows from the first end to the second end thereof; a second resistor having first and second ends and adapted so that the second reference current flows from the first end to the second end thereof; and voltage comparing means for comparing a first voltage drop generated by the flow of the second detection current across the first resistor and a second voltage drop generated by the flow of the second reference current across the second resistor with each other to provide an output signal on the basis of the comparison result.

As above described, the light intensity deterioration detecting circuit of the third aspect of the present invention comprises the transistor having the first electrode receiving the first detection current, and the second electrode connected to the reference current supply means for supplying the control current from the control electrode to the second electrode only when the first detection current is less than the first reference current; the first resistor adapted so that the second detection current based on the control current flows from the first end to the second end thereof; the second resistor adapted so that the second reference current flows from the first end to the second end thereof; and the voltage comparing means for comparing the first voltage drop generated by the flow of the second detection current across the first resistor with the second voltage drop generated by the flow of the second reference current across the second resistor to output the output signal on the basis of the comparison result.

The amount of the second reference current and the resistances of the first and second resistors are set such that the greater of the first and second voltage drops in the normal state of the light emitting means is different from that in the light intensity deteriorated state thereof, whereby the light intensity deterioration of the light emitting means is detected from the output signal of the voltage comparing means.

The detection accuracy of the light intensity deterioration by the output signal of the voltage comparing means is lowered in proportion to the errors made by the resistance ratio of the first resistor to the second resistor. The errors in the resistance ratio of the first resistor to the second resistor is reduced to a negligible level by fabricating the first and second resistors in the same process step if the respective resistances of the first and second resistors have relatively large errors. Thus the deterioration of the current to light output characteristic of the light emitting means is correctly detected without an offset control.

It is an object of the present invention to provide a light intensity deterioration detecting circuit which correctly detects deterioration of a current to light output characteristic of a light emitting means without an offset control.

These and other objects, features, aspects and advantages of the present invention will become more apparent from the following detailed description of the present invention when taken in conjunction with the accompanying drawings.

DESCRIPTION OF THE PREFERRED EMBODIMENTS

<<First Preferred Embodiment>>
<Basic Construction>

Figure 1:
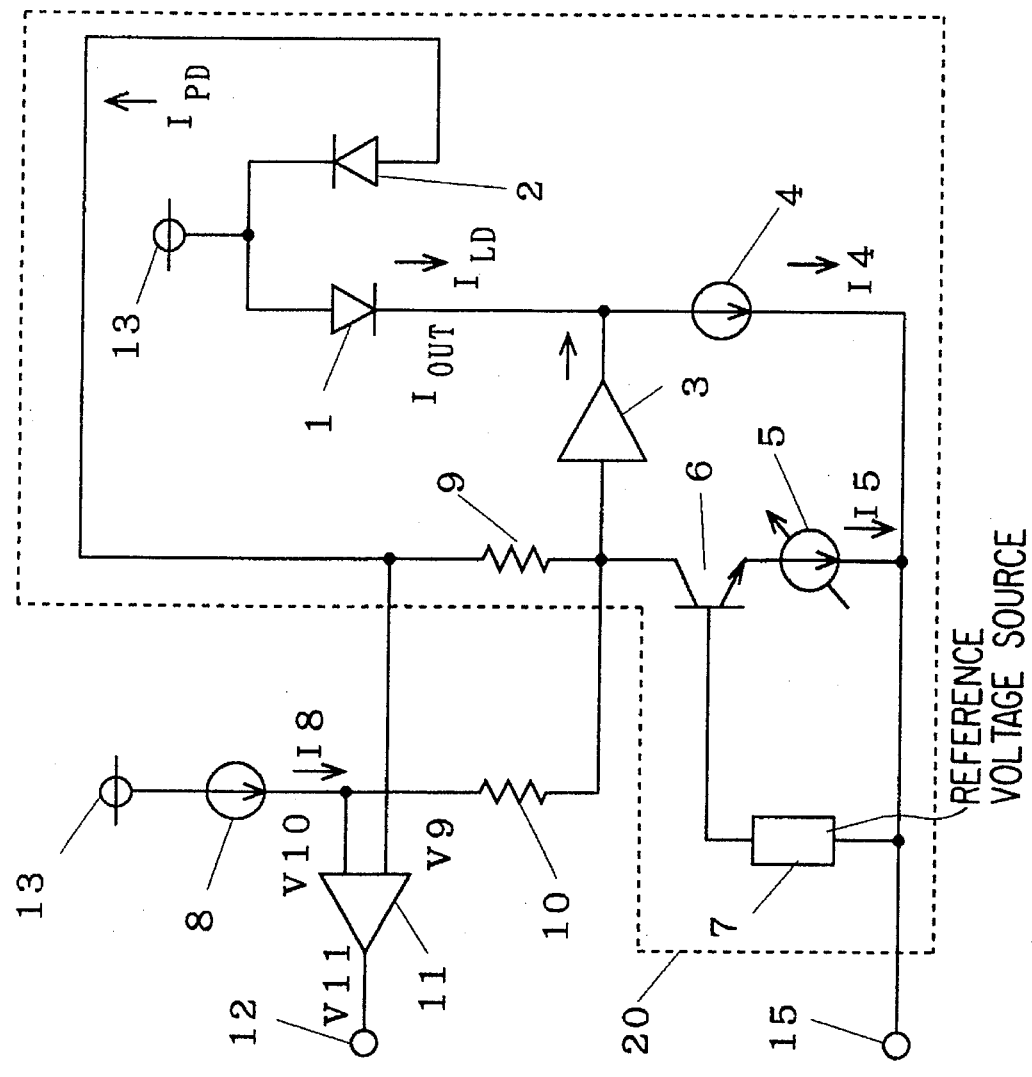
FIG. 1 is a circuit diagram of a light intensity deterioration detecting circuit according to a first preferred embodiment of the present invention.

FIG. 1 is a circuit diagram of a light intensity deterioration detecting circuit according to a first preferred embodiment of the present invention. As shown in FIG. 1, the anode of a laser diode 1 serving as a light emitter is connected to a power supply 13, and the cathode of a photodiode 2 serving as a photodetector is connected to the power supply 13. The cathode of the laser diode 1 is connected to a ground terminal 15 upon which a ground potential is impressed through a driving reference current source 4 and is connected to the output of a current amplifier circuit 3. The anode of the photodiode 2 is connected to a first end of a resistor 9. A reference current source 8 is connected between the power supply 13 and a first input of a comparator 11. The first input of the comparator 11 is connected to a first end of a resistor 10, and a second input thereof is connected to the first end of the resistor 9.

The comparator 11 compares a comparison voltage V10 provided at the first end of the resistor 10 and a comparison voltage V9 provided at the second end of the resistor 9 with each other to output an output voltage V11 on the basis of the comparison result to an output terminal 12. It should be noted that the comparator 11 may be formed by using a conventional operational amplifier having a first positive input and a second negative input.

The input of the current amplifier circuit 3 is connected to the second end of the resistor 9, a second end of the resistor 10 and the collector of an NPN bipolar transistor 6. The NPN bipolar transistor 6 has an emitter connected to the ground terminal 15 through a reference current source 5, and a base connected to the ground terminal 15 through a reference voltage source 7. The reference voltage source 7 includes a band gap circuit or the like to be described later.

The above-mentioned laser diode 1, photodiode 2, current amplifier circuit 3, reference current source 4, reference current source 5, NPN bipolar transistor 6, reference voltage source 7, and a resistor 9 form an APC circuit 20.

The output voltage V11 of the comparator 11 is determined by $$V11 = \alpha \cdot (R9 \cdot I_{PD} - R10 \cdot I8) \quad (1)$$

where R9 is the resistance of the resistor 9, R10 is the resistance of the resistor 10, and α is the amplification factor of the comparator 11 (ideally ∞).
<Current Amplifier Circuit>

Figure 2:
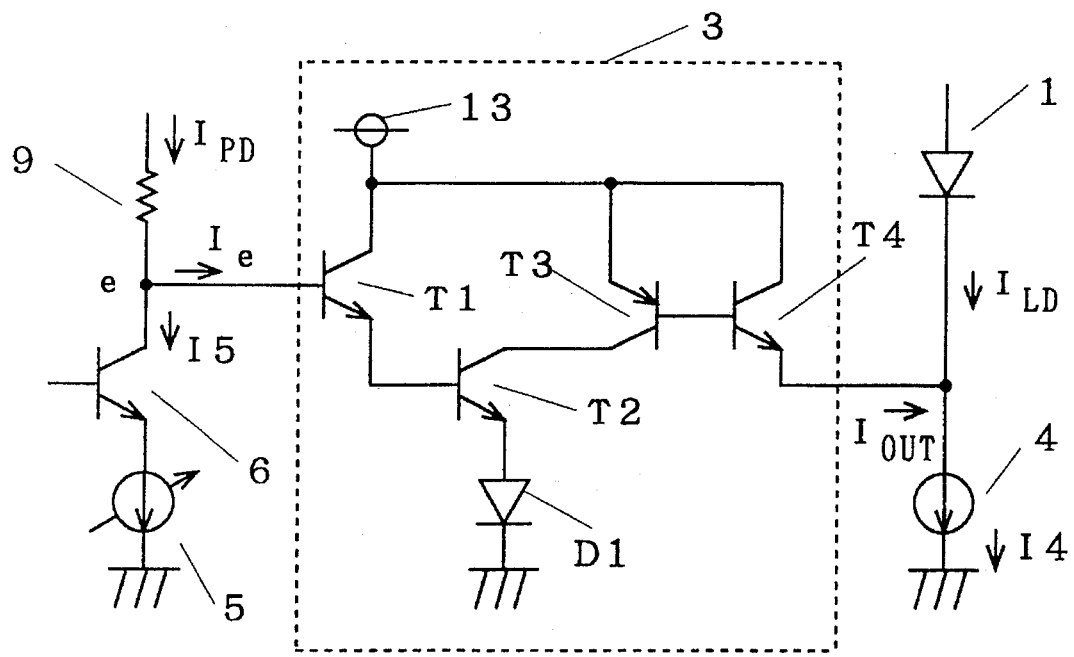
FIG. 2 is a circuit diagram showing the internal construction of a current amplifier circuit shown in FIG. 1.

FIG. 2 is a circuit diagram showing the internal construction of the current amplifier circuit 3 shown in FIG. 1. As shown in FIG. 2, the current amplifier circuit 3 includes PNP bipolar transistors T1, T2, T4 and an NPN bipolar transistor T3.

The transistor T1 has a collector connected to the power supply 13, a base connected to the second end of the resistor 9, and an emitter connected to the base of the transistor T2. The transistor T2 has a collector connected to the collector of the transistor T3, and an emitter connected to the anode of a diode D1 having a cathode grounded. The transistor T3 has an emitter connected to the power supply 13, and a base connected to the base of the transistor T4. The transistor T4 has a collector connected to the power supply 13.

Current provided from the emitter of the transistor T4 is outputted in the form of an output current $I_{OUT}$.

In such an arrangement, the following equations hold:

$$I_e = I_{PD} - I5 \quad (2)$$

$$I_{OUT} = \alpha 1 \cdot \alpha 2 \cdot \alpha 3 \cdot \alpha 4 \cdot I_e \quad (3)$$

$$I_{LD} = I_{OUT} - I4 \quad (4)$$

where $I_e$ is a base current of the transistor T1, I4 and I5 are reference currents of the reference current sources 4 and 5, respectively, and α1 to α4 are current amplification factors of the transistors T1 to T4, respectively.

The current amplifier circuit 3 provides the output current $I_{OUT}$ which is the amplified base current $I_e$ in accordance with Equation (3).
<First Reference Current Source>

Figure 3:
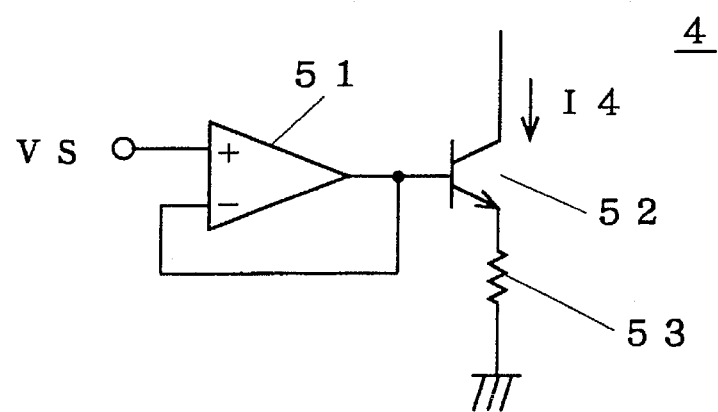
FIG. 3 is a circuit diagram showing the internal construction of a first reference current source shown in FIG. 1.
Figure 4:
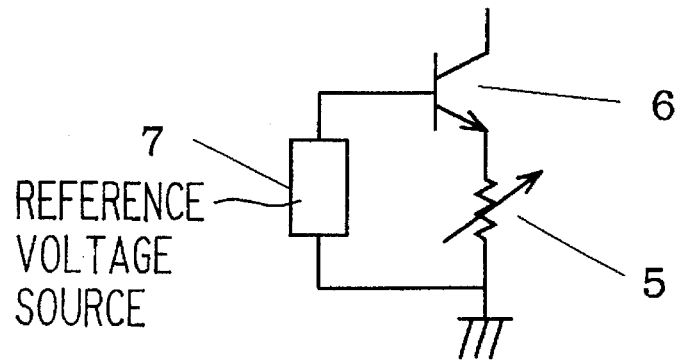
FIG. 4 is a circuit diagram showing the internal construction of a second reference current source shown in FIG. 1.

FIG. 3 is a circuit diagram showing the internal construction of the reference current source 4 shown in FIG. 1. As shown in FIG. 4, the reference current source 4 includes an operational amplifier 51, an NPN bipolar transistor 52, and a resistor 53. A constant voltage VS is applied to a positive input of the operational amplifier 51, and the output of the operational amplifier 51 is applied to the base of the transistor 52 and is fed back to a negative input thereof. The emitter of the transistor 52 is grounded through the resistor 53. Current flowing in the transistor 52 serves as the reference current I4.

Application of the output current of the operational amplifier 51 having negative feedback to the base of the transistor 52, ensures a stable flow of the reference current I4.
<Second Reference Current Source>

FIG. 4 is a detailed circuit diagram of the reference current source 5 shown in FIG. 1. As shown in FIG. 4, a variable resistor is used as the reference current source 5. The value of the reference current I5 may be varied by varying the resistance of the variable resistor.
<Third Reference Current Source>

Figure 5:
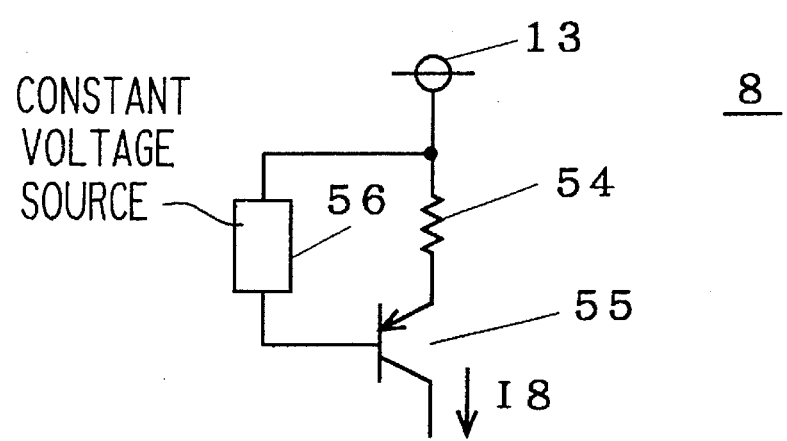
FIG. 5 is a circuit diagram showing the internal construction of a third reference current source shown in FIG. 1.

FIG. 5 is a circuit diagram showing the internal construction of the reference current source 8 shown in FIG. 1. As shown in FIG. 5, the reference current source 8 includes a resistor 54, a PNP bipolar transistor 55, and a constant voltage source 56. The resistor 54 has a first end connected to the power supply 13, and a second end connected to the emitter of the transistor 55. The constant voltage source 56 is connected between the first end of the resistor 54 and the base of the transistor 55.

The reference current I8 may be supplied from the collector of the transistor 55 by connecting the constant voltage source 56 between the emitter and base of the transistor 55 through the resistor 54.
<Operation>

Described below is an operation of the light intensity deterioration detecting circuit of the first preferred embodiment shown in FIG. 1. As a drive current $I_{LD}$ flows in the laser diode 1, the laser diode 1 emits light having an intensity (light output P (mW)) based on the drive current $I_{LD}$. The drive current $I_{LD}$ equals the reference current I4 of the reference current source 4 minus the output current $I_{OUT}$ of the current amplifier circuit 3.

The light emitted from the laser diode 1 is received by the photodiode 2, which in turn performs a photoelectric conversion on the basis of the intensity of the received light to carry the detection current $I_{PD}$ to the resistor 9.

A reference current I8 is supplied from the reference current source 8 to the resistor 10. The reference current I5 from the reference current source 5 flows from the second end of the resistor 9 to the ground terminal 15 through the NPN bipolar transistor 6.

Description will be given of operations in the following cases which are classified based on the relation in magnitude between the detection current $I_{PD}$, the reference current I5 and the reference current I8 when the laser diode 1 is normal.

A. Case where $I_{PD}$ +I8<I5 (Output Increase Control)

The input current to the current amplifier circuit 3 is zero, and the output current $I_{OUT}$ is zero. The drive current $I_{LD}$ of the laser diode 1 increases up to the reference current I4 of the reference current source 4 and the light intensity of the laser diode 1 increases. As a result, the detection current $I_{PD}$ of the photodiode 2 increases with the increasing light intensity of the laser diode 1, and control is exerted so that $(I_{PD}+I8)=I5$ holds.

B. Case where $I_{PD}+I8>I5$ (Output Decrease Control)

Current having the amount $(I_{PD}+I8-I5)>0$ is input to the current amplifier circuit 3, and the output current $I_{OUT}$ increases. Then the drive current $I_{LD}$ decreases and the light intensity of the laser diode 1 decreases. As a result, the detection current $I_{PD}$ of the photodiode 2 decreases with the decreasing light intensity of the laser diode 1, and control is exerted so that $(I_{PD}+I8)=I5$ holds.

In this manner, if the laser diode 1 is normal, the APC circuit 20 operates so that the three currents are stabilized when $I_{PD}+I8=I5$.

For example, if the resistance R9 equals the resistance R10 and I8=I5/2, the output voltage V11 of the comparator 11 is zero from Equation (1).

When the current to light output characteristic of the laser diode 1 is slightly deteriorated, the detection current $I_{PD}$ decreases to change the state into "$I_{PD}+I8 <I5$" for a short time period. However, the above-mentioned output increase control functions when the deterioration is slight, and an increase in the drive current $I_{PD}$ resulting from decreasing output current $I_{OUT}$ allows the light intensity of the laser diode 1 to be held constant. The output increase control is exerted until the output current $I_{OUT}$ equals zero and the drive current $I_{LD}$ equals the reference current I4.

When the current to light output characteristic of the laser diode 1 is abnormally deteriorated, the state is not changed from "$I_{PD}+I8<I5$" if the output current $I_{OUT}$ is zero, and the APC circuit 20 fails to perform the output increase control. In this case, the current amplifier circuit 3 is completely off and the state "$I_{PD}+I8<I5$" is fixed. The NPN bipolar transistor 6 is saturated, and a base current $I_B$ of the amount $(I5-(I_{PD}+I8))$ flows into the emitter to compensate for the decreased amount of the detection current $I_{PD}$. Then the following equation holds:

$$I_{PD}+I_B=I5/2 \quad (5)$$

Consequently, the state is stabilized, with the detection current $I_{PD}$ being less than the reference current I8 (I5/2). The output voltage V11 of the comparator 11 is $$V11 = \alpha \cdot (R9 \cdot I_{PD} - R10 \cdot I8) \quad (6)$$
$$= \alpha \cdot R9(I_{PD} - I8) < 0$$

In this manner, the light intensity deterioration detecting circuit of the first preferred embodiment detects whether the output voltage V11 of the comparator 11 is zero or negative which is determined on the basis of the comparison result between the voltage V9 at the first end of the resistor 9 carrying the detection current $I_{PD}$ and the voltage V10 at the first end of the resistor 10 carrying the reference current I8, thereby to verify whether the light intensity deterioration of the laser diode 1 occurs or not.

Since the output voltage V11 is determined from Equation (1) (shown again below), errors are produced in the output voltage V11 which are proportional to the resistance ratio (R9/R10) of the resistor 9 to the resistor 10.

$$V11=\alpha \cdot (R9 \cdot I_{PD}-R10 \cdot I8)$$

Resistance errors produced in resistors fabricated in the same process step have the same tendency. If ∓20 errors are produced in the individual resistances, the resistance ratio errors may be reduced to a negligible level. To minimize the resistance ratio errors, it is preferred that the resistors 9 and 10 have the same configuration and size.

Consequently, the light intensity deterioration detecting circuit of the first preferred embodiment correctly detects deterioration of the current to light output characteristic of the light emitter without an offset control.

<Field of Application>

Figure 6:
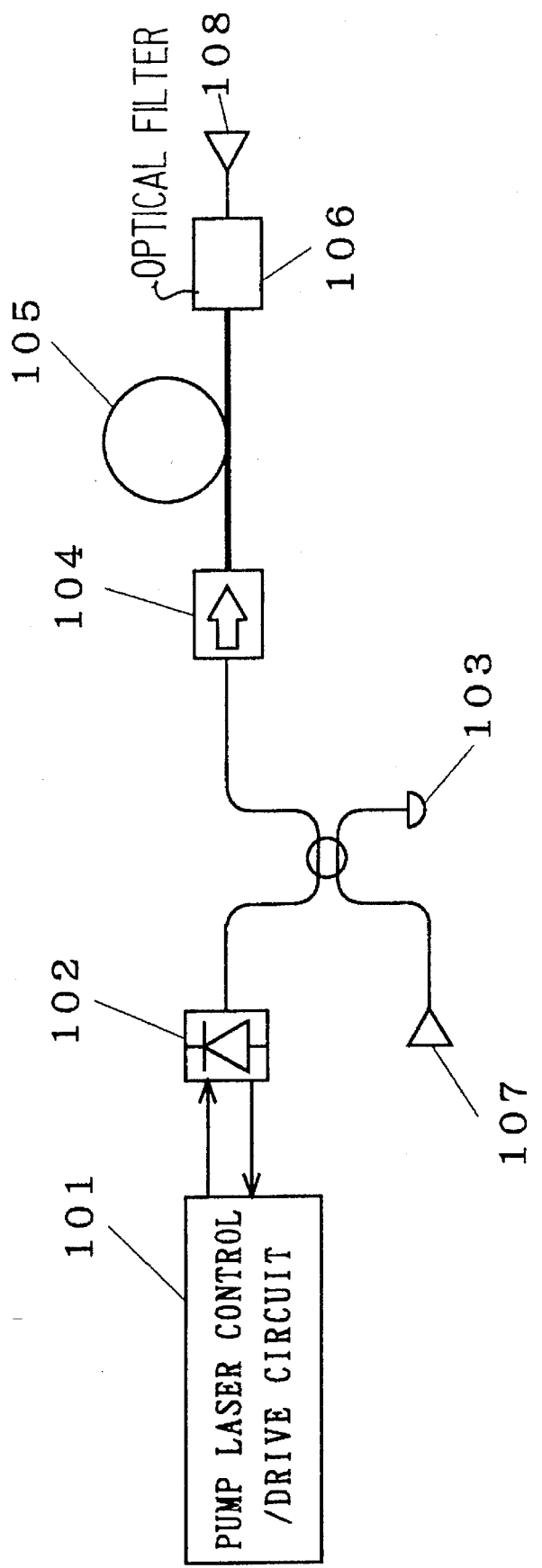
FIGS. 6 and 7 illustrate the construction of an Er fiber optic amplifier.
Figure 7:
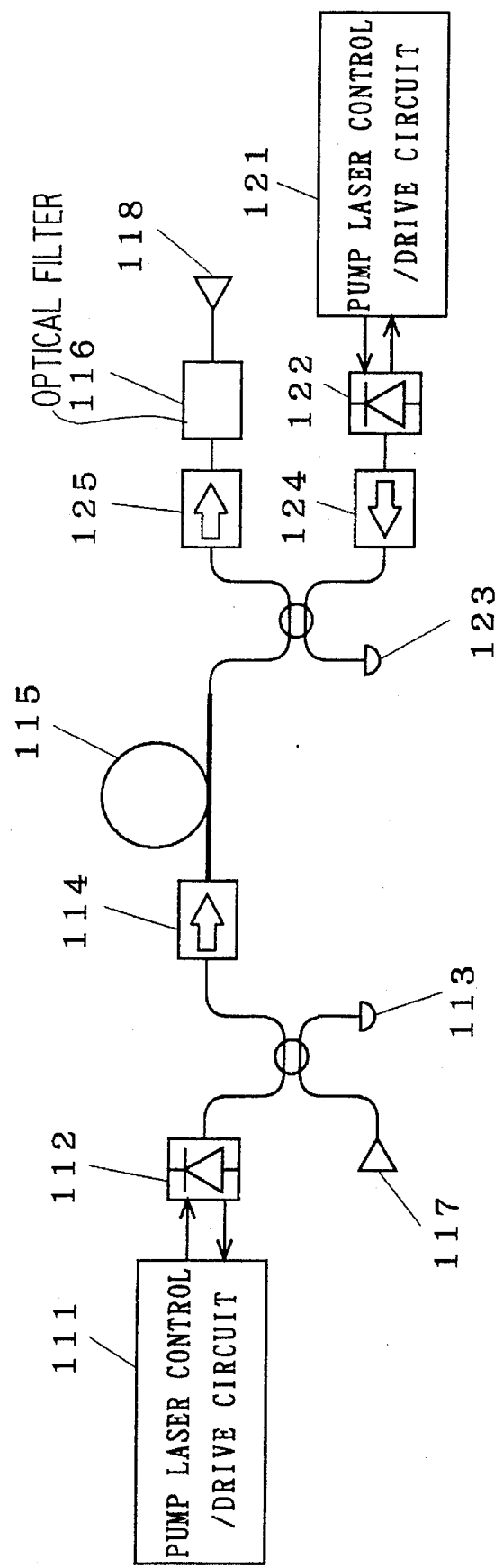

FIGS. 6 and 7 illustrate an erbium (Er) fiber optic amplifier which is one of the applications of the light intensity deterioration detecting circuit of the first preferred embodiment. FIG. 6 shows a forward excitation type, and FIG. 7 shows a bi-directional excitation type.

Referring to FIG. 6, an optical signal having a wavelength of, for example, 1.55 mm is received at an input port 107, and an LD module 102 outputs a laser light (e.g., 1.48 mm wavelength) serving as energy for exciting Er. A fiber coupler 103 synthesizes the optical signal and the laser light to output the synthetic light to an optical isolator 104. The isolator 104 outputs light having a predetermined direction in the synthetic light to an Er doped fiber 105. The Er doped fiber 105 amplifies the input light to output an output optical signal to an output port 108 through an optical filter 106.

A pump laser control/drive circuit 101 stably controls and drives the light output of the LD module 102. Thus, in the Er fiber optic amplifier of FIG. 6, the light intensity deterioration detecting circuit of the first preferred embodiment corresponds to the pump laser control/drive circuit 101, and the laser diode 1 corresponds to the LD module 102. It is a customary practice to integrally form the pump laser control/drive circuit 101 and the LD module 102.

The Er fiber optic amplifier shown in FIG. 7 is of a bi-directional excitation type using two LD modules 112 and 122. The reference numeral 111 designates a pump laser control/drive circuit for stably controlling and driving the light output of the LD module 112; 121 designates a pump laser control/drive circuit for stably controlling and driving the light output of the LD module 122; 113, 123 designate fiber couplers; 114, 124, 125 designate optical isolators; 116 designates an optical filter; 117 designates an input port; and 118 designates an output port.

In the Er fiber optic amplifier shown in FIG. 7, the light intensity deterioration detecting circuit of the first preferred embodiment corresponds to the pump laser control/drive circuit 111 or 112, and the laser diode 1 corresponds to the LD module 112 or 122. It is a customary practice to integrally form the pump laser control/drive circuit 111 (121) and the LD module 112 (122).

It should be noted that the Er fiber optic amplifiers of FIGS. 6 and 7 are also one of the applications of the light intensity deterioration detecting circuit of second to fourth preferred embodiments to be described below.

<Second Preferred Embodiment>

Figure 8:
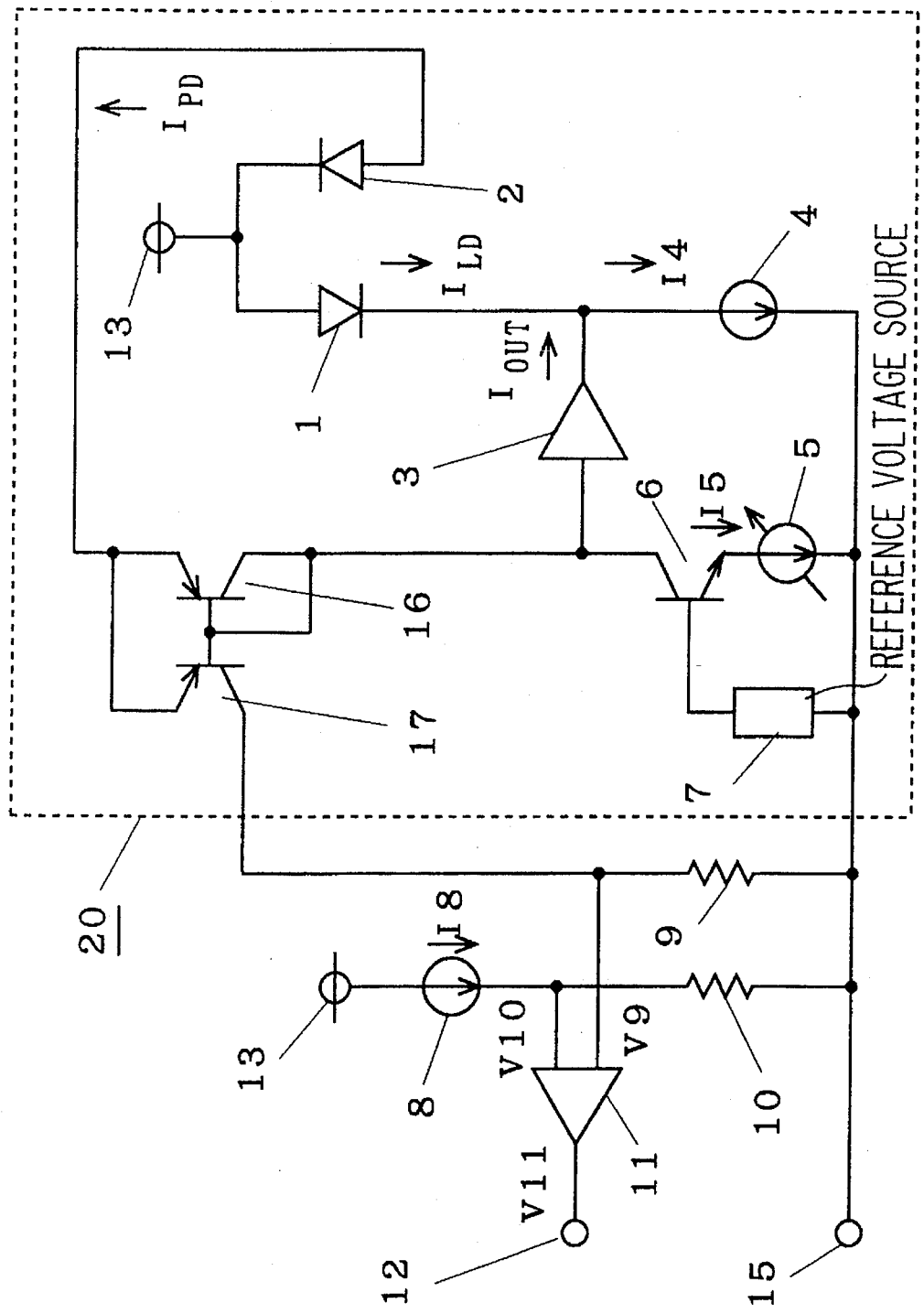
FIG. 8 is a circuit diagram of the light intensity deterioration detecting circuit according to a second preferred embodiment of the present invention.

FIG. 8 is a circuit diagram of the light intensity deterioration detecting circuit according to a second preferred embodiment of the present invention. As shown in FIG. 8, the anode of the laser diode 1 serving as a light emitter is connected to the power supply 13, and the cathode of the photodiode 2 serving as a photodetector is connected to the power supply 13. The cathode of the laser diode 1 is connected to the ground terminal 15 through the reference current source 4 and is connected to the output of the current amplifier circuit 3.

A PNP bipolar transistor 16 having common base and collector and a PNP bipolar transistor 17 form a current mirror circuit. The emitters of the PNP bipolar transistor 16 and the PNP bipolar transistor 17 are commonly connected to the anode of the photodiode 2. The collector of the PNP bipolar transistor 17 is connected to the first end of the resistor 9. It should be noted that the PNP bipolar transistors 16 and 17 are of the same transistor size.

The reference current source 8 is connected between the power supply 13 and the first input of the comparator 11. The first input of the comparator 11 is connected to the first end of the resistor 10, and the second input thereof is connected to the first end of the resistor 9.

The comparator 11 compares the comparison voltage V10 provided at the first end of the resistor 10 and the comparison voltage V9 provided at the first end of the resistor 9 with each other to output the output voltage Vii to the output terminal 12 on the basis of the comparison result. The comparator 11 may be formed using a conventional operational amplifier having a first positive input and a second negative input.

The input of the current amplifier circuit 3 is connected to the collector of the PNP bipolar transistor 16 and the collector of the NPN bipolar transistor 6. The NPN bipolar transistor 6 has an emitter connected to the ground terminal 15 through the reference current source 5, and a base connected to the ground terminal 15 through the reference voltage source 7.

The above-mentioned laser diode 1, photodiode 2, current amplifier circuit 3, reference current source 4, reference current source 5, NPN bipolar transistor 6, reference voltage source 7, PNP bipolar transistor 16, and PNP bipolar transistor 17 form the APC circuit 20.

Like the first preferred embodiment, where R9 is the resistance of the resistor 9, R10 is the resistance of the resistor 10, and α is the amplification factor of the comparator 11 (ideally ∞), the detection current $I_{PD}$ is Correctly divided into two by the current mirror circuit comprised of the PNP bipolar transistors 16 and 17, and the same amount of current ($I_{PD}/2$) flows to the collector of the NPN bipolar transistor 6 and the first end of the resistor 9.

The output voltage V11 of the comparator 11 is determined by $$V11 = \alpha \cdot (R9 \cdot I_{PD}/2 - R10 \cdot I8) \tag{7}$$

Description will be given on the operation of the light intensity deterioration detecting circuit of the second preferred embodiment shown in FIG. 8.

The drive current $I_{LD}$ flows in the laser diode 1 which in turn emits light having an intensity based on the drive current $I_{LD}$. The drive current $I_{LD}$ equals the reference current I4 of the reference current source 4 minus the output current $I_{OUT}$ of the current amplifier circuit 3.

The photodiode 2 receives the light emitted from the laser diode 1 and carries the detection current Ipn to the resistor 9 on the basis of the intensity of the received light.

The reference current I8 is supplied from the reference current source 8 to the resistor 10. The reference current I5 from the reference current source 5 passes through the NPN bipolar transistor 6 and flows from the second end of the resistor 9 to the ground terminal 15.

Description will be given of operations in the following cases which are classified based on the relation in magnitude between the detection current $I_{PD}$, the reference current I5, and the reference current I8 when the laser diode 1 is normal.

A. Case where $I_{PD}/2 < I5$ (Output Increase Control)

The input current to the current amplifier circuit 3 is zero, and the output current $I_{OUT}$ is zero. The drive current $I_{LD}$ of the laser diode 1 increases up to the reference current I4 of the reference current source 4, and the light intensity of the laser diode 1 increases. As a result, the detection current $I_{PD}$ of the photodiode 2 increases with the increasing light intensity of the laser diode 1. Control is exerted so that ($I_{PD}/2$)=I5 holds.

B. Case where $I_{PD}/2 > I5$ (Output Decrease Control)

Current having the amount ($I_{PD}/2 - I5$)>0 is input to the current amplifier circuit 3, and the output current $I_{OUT}$ increases. Then the drive current $I_{LD}$ decreases, and the light intensity of the laser diode 1 decreases. As a result, the detection current $I_{PD}$ of the photodiode 2 decreases with the decreasing light intensity of the laser diode 1, and thus control is exerted so that $I_{PD}/2$=I5 holds. In this manner, if the laser diode 1 is normal, the APC circuit 20 operates so that the three currents are stabilized when $I_{PD}/2$=I5.

For example, if the resistance R9 equals the resistance R10 and I8 =I5, the output voltage V11 of the comparator 11 is zero from Equation (7).

If the current to light output characteristic of the laser diode 1 is slightly deteriorated, the detection current $I_{PD}$ decreases to change the state into "$I_{PD}/2 = I5$" for a short time period. However, the above-mentioned output increase control functions, and an increase in the drive current $I_{PD}$ resulting from decreasing output current $I_{OUT}$ allows the light intensity of the laser diode 1 to be held constant. The output increase control is exerted until the output current $I_{OUT}$ equals zero and the drive current $I_{LD}$ equals the reference current I4.

When the current to light output characteristic of the laser diode 1 is abnormally deteriorated, the state is not changed from "$I_{PD}/2 < I5$" if the output current $I_{OUT}$ is zero, and the APC circuit 20 fails to perform the output increase control.

In this case, the current amplifier circuit 3 is completely off and the state "$I_{PD}/2 < I5$" is fixed. The NPN bipolar transistor 6 is saturated, and a base current $I_B$ of the amount (I5-$I_{PD}/2$) flows into the emitter to compensate for the decreased amount of the detection current $I_{PD}$. Then the following equation holds:

$$I_{PD}/2 + I_B = I5 \tag{8}$$

Consequently, the state is stabilized, with the detection current $I_{PD}/2$ being less than the reference current I5. The output voltage V11 of the comparator 11 is $$\begin{aligned} V11 &= \alpha \cdot (R9 \cdot I_{PD}/2 - R10 \cdot I8) \\ &= \alpha \cdot R9(I_{PD}/2 - I8) < 0 \end{aligned} \tag{9}$$

In this manner, the light intensity deterioration detecting circuit of the second preferred embodiment detects whether the output voltage V11 of the comparator 11 is zero or negative which is determined on the basis of the comparison result between the voltage V9 at the first end of the resistor 9 carrying the detection current $I_{PD}$ and the voltage V10 at the first end of the resistor 10 carrying the reference current I8, thereby to verify whether the light intensity deterioration of the laser diode 1 occurs or not, as in the first preferred embodiment.

Further, like the first preferred embodiment, since errors of the output voltage V11 are produced depending on errors of the resistance ratio (R9/R10) of the resistor 9 to the resistor 10. If relatively large errors are produced in the individual resistances, the resistance ratio errors may be reduced to a negligible level.

Consequently, the light intensity deterioration detecting circuit of the second preferred embodiment correctly detects deterioration of the current to light output characteristic of the light emitter without an offset control.

Further, the light intensity deterioration detecting circuit (FIG. 1) of the first preferred embodiment is disadvantageous in that, if light intensity deterioration occurs in the laser diode 1, the potential at the first end of the resistor 9 varies as the amount of the detection current $I_{PD}$ changes, resulting in changes in the anode-cathode voltage of the photodiode 2. In the light intensity deterioration detecting circuit (FIG. 8) of the second preferred embodiment, however, the base-emitter voltage of the PNP bipolar transistor 16 is held constant independently of changes in the amount of the detection current $I_{PD}$, permitting the anode-cathode voltage of the photodiode 2 to be held constant.

<Third Preferred Embodiment>

Figure 9:
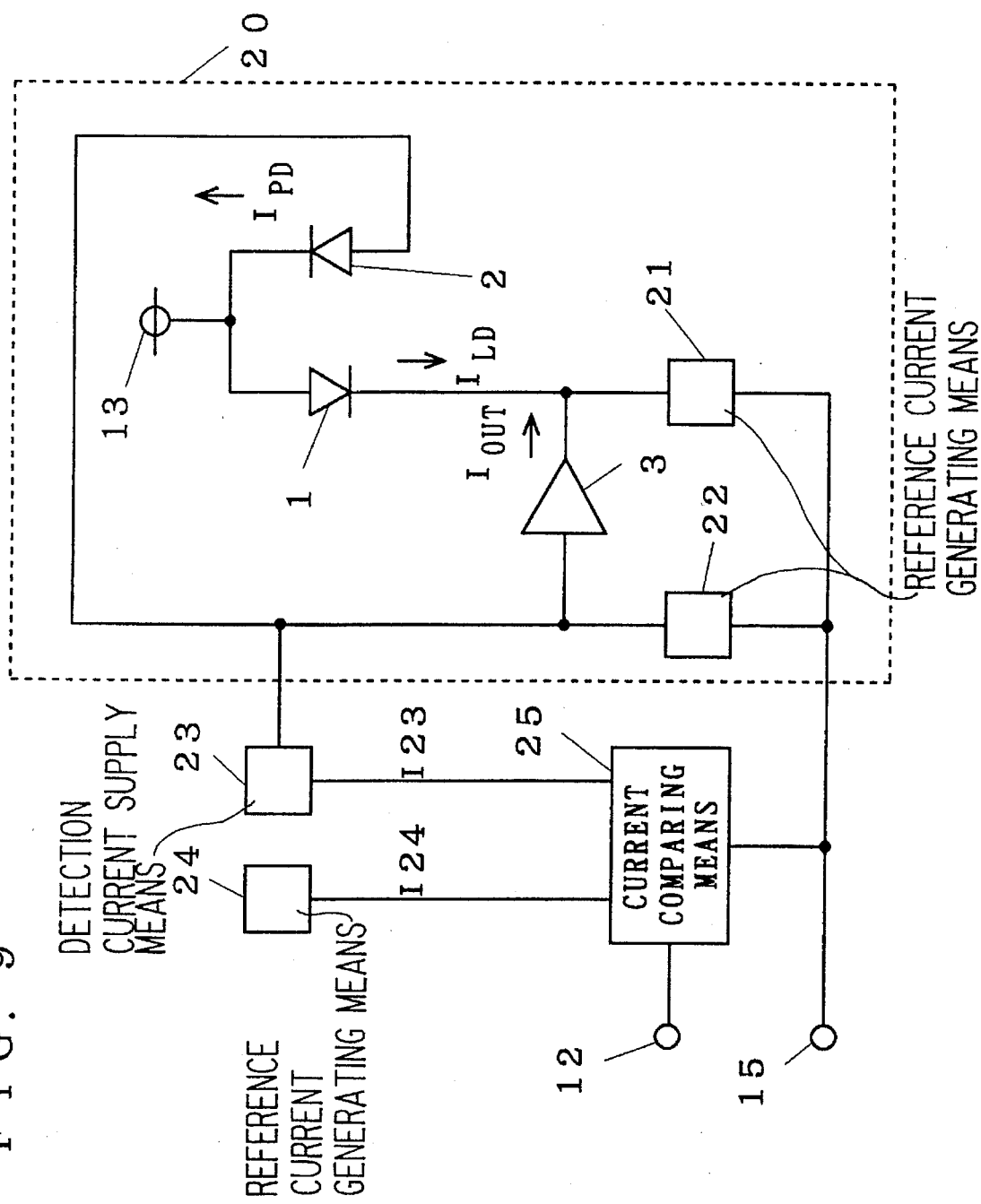
FIG. 9 is a schematic diagram of the light intensity deterioration detecting circuit according to a third preferred embodiment of the present invention.

FIG. 9 is a schematic diagram of the light intensity deterioration detecting circuit according to a third preferred embodiment of the present invention.

As shown in FIG. 9, the anode of the laser diode 1 serving as a light emitter is connected to the power supply 13, and the cathode of the photodiode 2 serving as a photodetector is connected to the power supply 13. The cathode of the laser diode 1 is connected to the ground terminal through a reference current generating means 21 and is connected to the output of the current amplifier circuit 3. The anode of the photodiode 2 is connected to a reference current generating means 22 and a detection current supply means 23. The reference current generating means 21 and 22 are means for supplying a predetermined reference current. The detection current supply means 23 is a means for supplying a detection current I23 having an amount based on the detection current $I_{PD}$.

The reference numeral 24 designates a reference current generating means for supplying a reference current I24. A current comparing means 25 receives the reference current I24 and the detection current I23 and outputs a judgement signal S25 from the output terminal 12 on the basis of the comparison result between the detection current I23 and the reference current I24.

The detection current I23 from the detection current supply means 23 and the reference current I24 from the reference current generating means 24 are set so that I23>I24 when the laser diode 1 is normal and I23<I24 when the light intensity of the laser diode 1 is deteriorated and the current to light output characteristic is deteriorated to a defective level.

The above-mentioned laser diode 1, photodiode 2, current amplifier circuit 3, reference current generating means 21, and reference current generating means 22 form the APC circuit 20.

In such a construction, the output increase control and the output decrease control of the laser diode 1 are performed under control of the APC circuit 20 in the same manner as the first and second preferred embodiments.

When the laser diode 1 is normal, the relation between the detection current I23 and the reference current I24 is I23 >I24. Then the current comparing means 25 outputs the judgement signal S25 indicative of the normal state from the output terminal 12.

When the current to light output characteristic of the laser diode 1 is abnormally deteriorated, the relation between the detection current I23 and the reference current I24 is I23 <I24. Then the current comparing means 25 outputs the judgement signal S25 indicative of the abnormal state from the output terminal 12.

As above described, the light intensity deterioration detecting circuit of the third preferred embodiment verifies whether light intensity deterioration occurs in the laser diode 1 or not by comparing the detection current I23 based on the detection current $I_{PD}$ with the reference current I24.

The verification may be performed without resistors and is not affected by the errors of resistances and resistance ratios. The light intensity deterioration detecting circuit of the third preferred embodiment, therefore, detects deterioration of the current to light output characteristic of the light emitter more correctly than those of the first and second preferred embodiments without an offset control.

Figure 10:
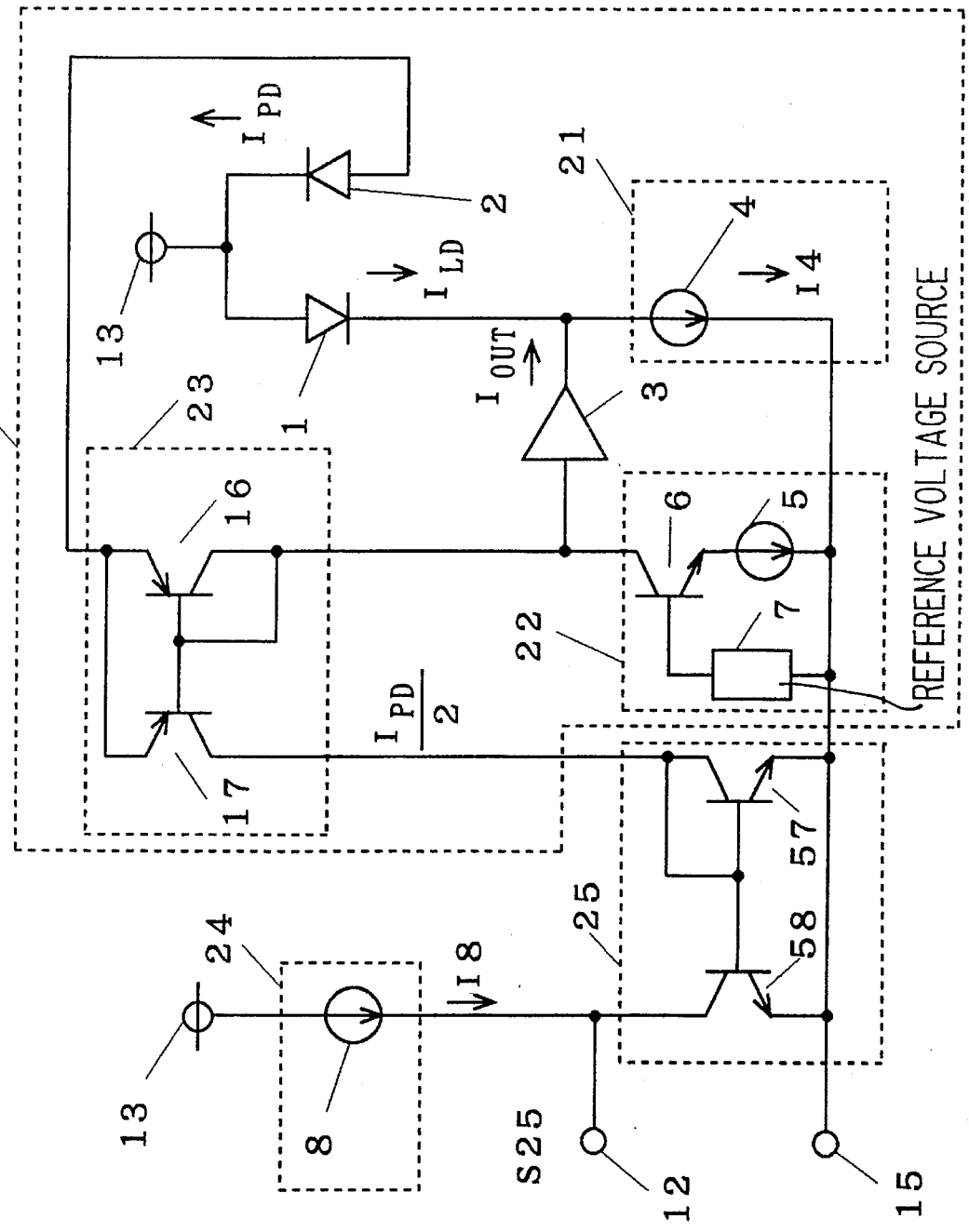
FIG. 10 is a detailed circuit diagram of the light intensity deterioration detecting circuit according to the third preferred embodiment of the present invention.

FIG. 10 is a detailed circuit diagram of the light intensity deterioration detecting circuit of the third preferred embodiment shown in FIG. 9. As shown in FIG. 10, the reference current generating means 21 includes the reference current source 4 for supplying the reference current I4, and the reference current generating means 22 includes the reference current source 5 for supplying the reference current I5, the NPN bipolar transistor 6, and the reference voltage source 7. The detection current supply means 23 includes the PNP bipolar transistor 16 and the PNP bipolar transistor 17 which form the current mirror circuit, and the reference current generating means 24 includes the reference current source 8 for supplying the reference current I8 (corresponding to the reference current I24 of FIG. 9). The construction and operation of the individual components of the third preferred embodiment are identical with those of the light intensity deterioration detecting circuit of the second preferred embodiment, and the description thereof will be omitted herein. It should be noted herein that the PNP bipolar transistor 16 and the PNP bipolar transistor 17 are of the same transistor size. Thus, current $I_{PD}/2$ (corresponding to the detection current I23 of FIG. 9) flows from the collector of the PNP bipolar transistor 17.

The current comparing means 25 includes a PNP bipolar transistor 57 and a PNP bipolar transistor 58 which form a current mirror circuit. The collector of the transistor 57, which has common base and collector, is connected to the collector of the PNP bipolar transistor 17. The collector of the transistor 58 is connected to the reference current source 8 and the output terminal 12. The emitters of the transistors 57 and 58 are commonly connected to the ground terminal 15. The transistors 57 and 58 are of the same transistor size.

The collector current $I_{PD}/2$ of the PNP bipolar transistor 17 and the reference current I8 are set so that $I_{PD}/2$>I8 when the laser diode 1 is normal and $I_{PD}/2$<I8 when the light intensity of the laser diode 1 is deteriorated and the current to light output characteristic is deteriorated to the defective level.

In such a construction, the output increase control and the output decrease control of the laser diode 1 are performed under control of the APC circuit 20 in the same manner as the first and second preferred embodiments.

When the laser diode 1 is normal, $I_{PD}/2$>I8. current having the amount $(I_{PD}/2-I8)$ flows from the output terminal 12 to the ground terminal 15 through the transistor 58. Then the judgement signal S25 at the L level (ground level) indicative of the normal state is outputted from the output terminal 12.

When the current to light output characteristic of the laser diode 1 is abnormally deteriorated, $I_{PD}/2$<I8. current having the amount $(I8-I_{PD}/2)$ flows from the reference current source 8 connected to the power supply 13 to the output terminal 12. Then the judgement signal S25 at the H level (voltage of the power supply 13) indicative of the abnormal state is outputted from the output terminal 12.

<<Fourth Preferred Embodiment>>

Figure 11:
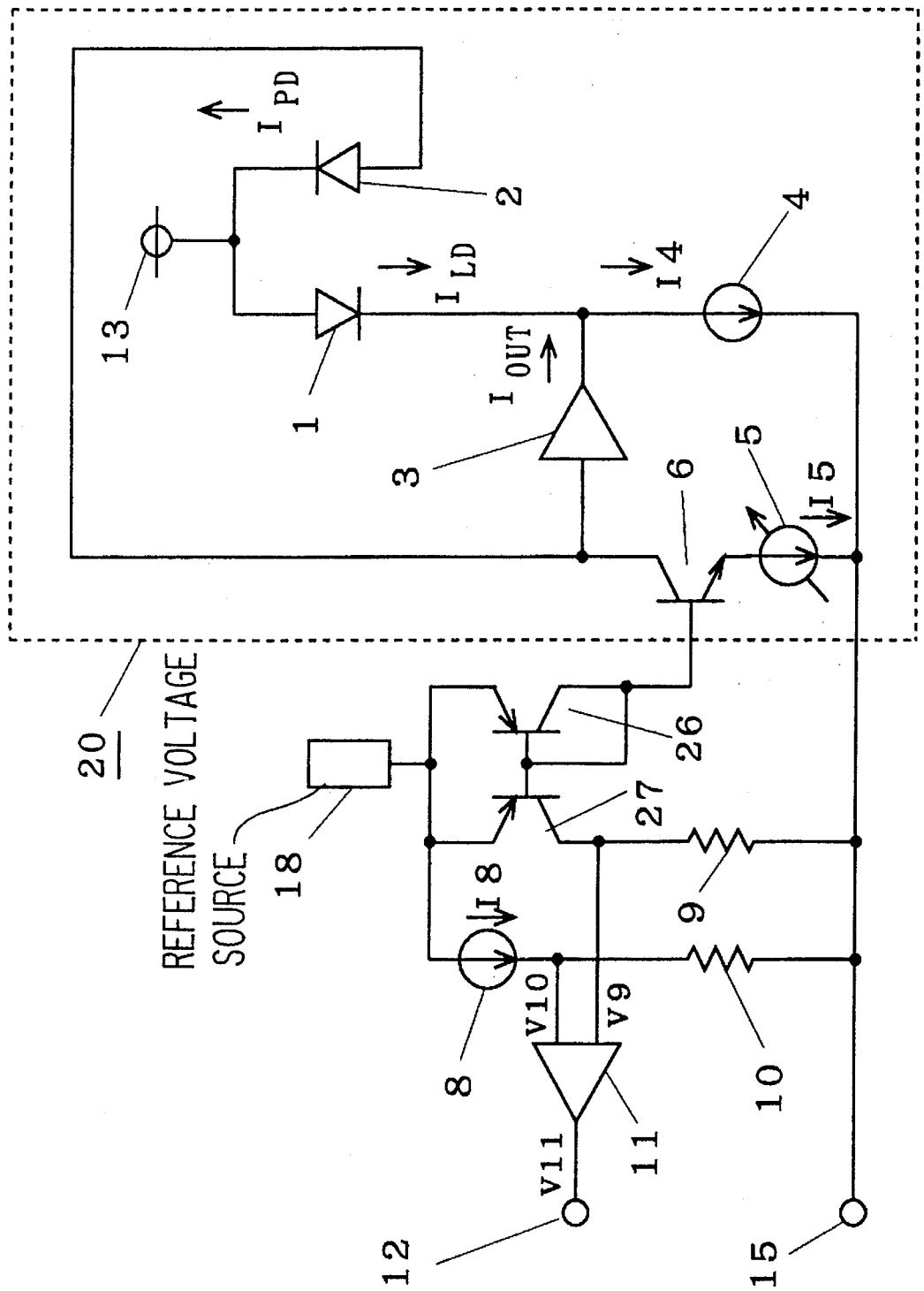
FIG. 11 is a circuit diagram of the light intensity deterioration detecting circuit according to a fourth preferred embodiment of the present invention.

FIG. 11 is a circuit diagram of the light intensity deterioration detecting circuit according to a fourth preferred embodiment of the present invention. As shown in FIG. 11, the anode of the laser diode 1 serving as a light emitter is connected to the power supply 13, and the cathode of the photodiode 2 serving as a photodetector is connected to the power supply 13. The cathode of the laser diode 1 is connected to the ground terminal 15 through the reference current source 4 and is connected to the output of the current amplifier circuit 3.

A PNP bipolar transistor 26 having common base and collector and a PNP bipolar transistor 27 form a current mirror circuit. The emitters of the PNP bipolar transistors 26 and 27 are commonly connected to a reference voltage source 18. The collector of the PNP bipolar transistor 27 is connected to the first end of the resistor 9.

The reference current source 8 is connected between the reference voltage source 18 and the first input of the comparator 11. The first input of the comparator 11 is connected to the first end of the resistor 10 and the second input thereof is connected to the first end of the resistor 9. The second ends of the resistors 9 and 10 are commonly connected to the ground terminal 15.

The comparator 11 compares the comparison voltage V10 provided at the first end of the resistor 10 and the comparison voltage V9 provided at the first end of the resistor 9 with each other to output the output voltage V11 to the output terminal 12 on the basis of the comparison result.

The input of the current amplifier circuit 3 is connected to the anode of the photodiode 2 and the collector of the NPN bipolar transistor 6. The NPN bipolar transistor 6 has an emitter connected to the ground terminal 15 through the reference current source 5, and a base connected to the collector of the PNP bipolar transistor 26.

The above-mentioned laser diode 1, photodiode 2, current amplifier circuit 3, reference current source 4, reference current source 5, and NPN bipolar transistor 6 form the APC circuit 20.

The reference current I8 supplied from the reference current source 8 is set to a micro level approximating zero.

<Constant Voltage Circuit>

Figure 12:
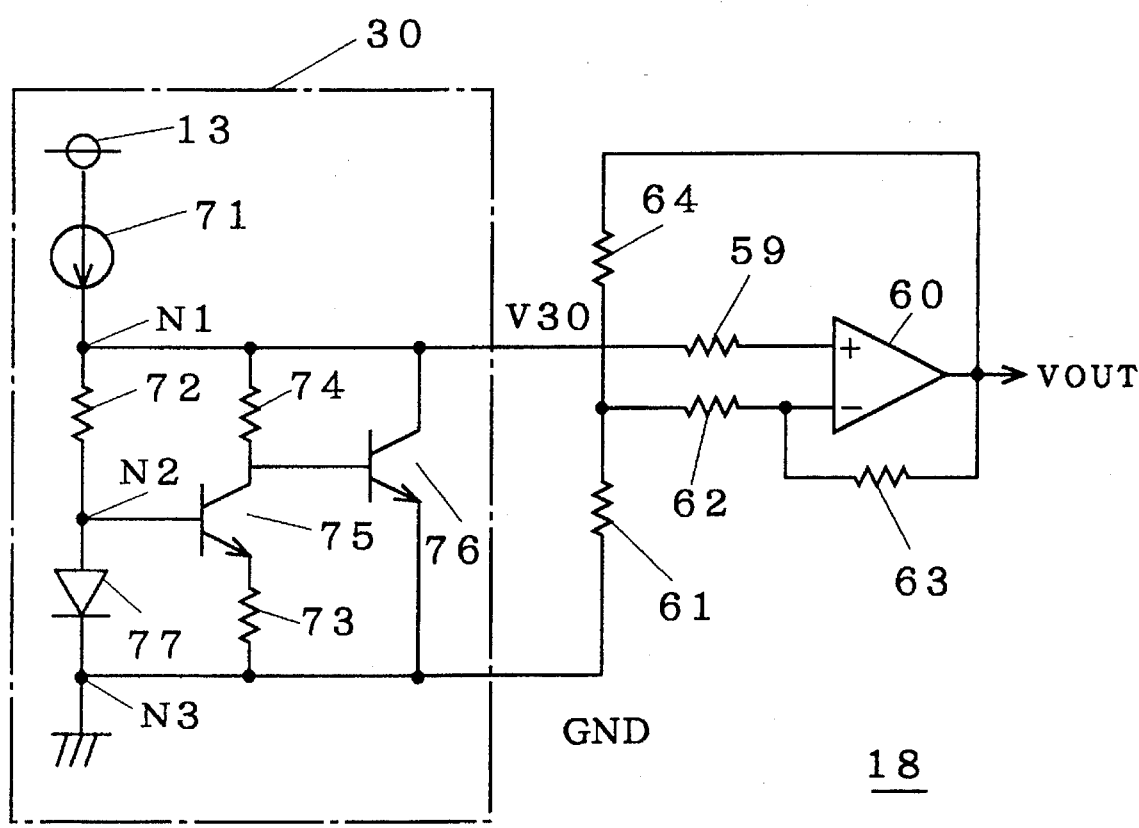
FIG. 12 is a circuit diagram showing the internal construction of a reference voltage source shown in FIG. 11.
Figure 13:
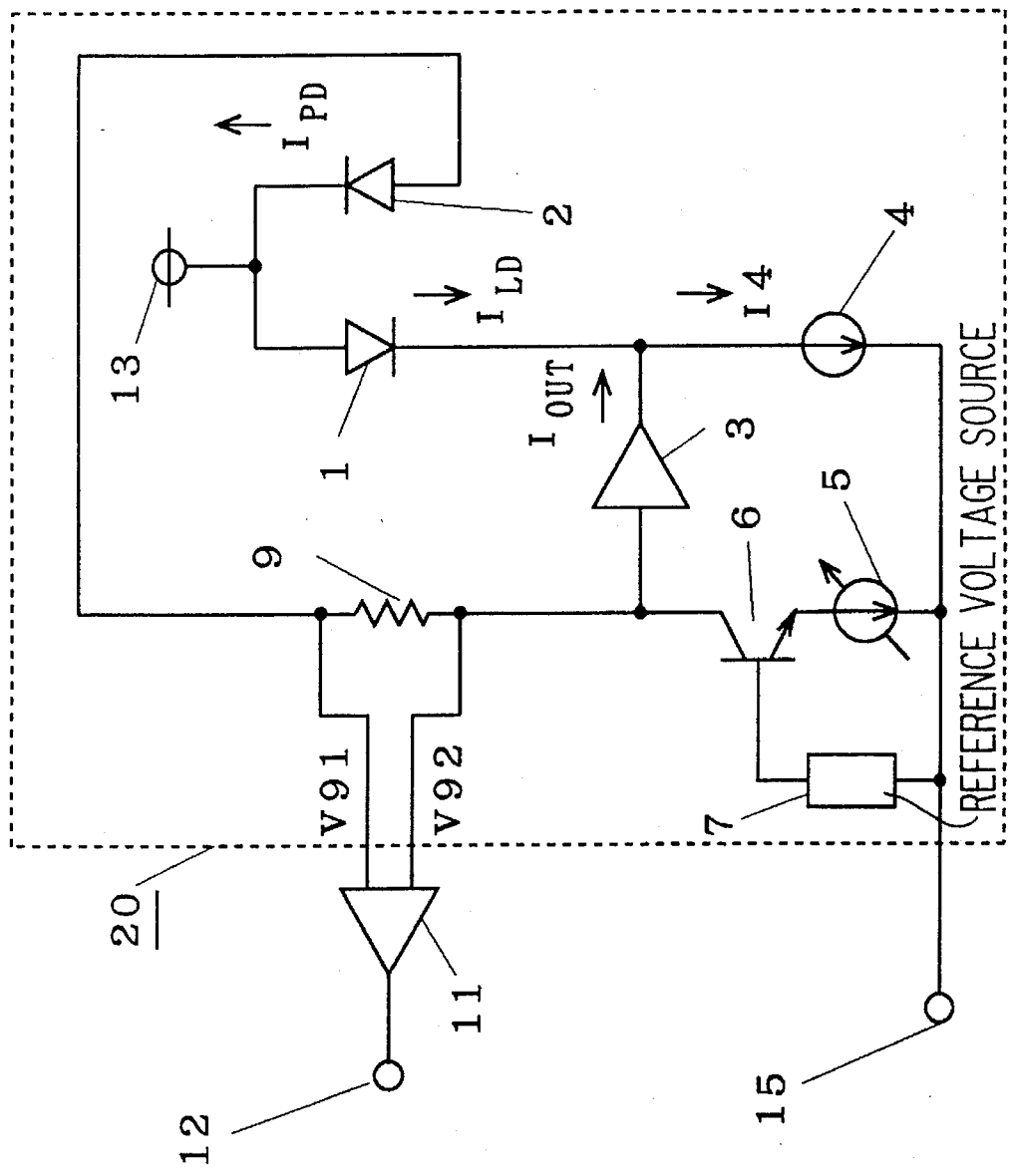
FIG. 13 is a circuit diagram of a conventional light intensity deterioration detecting circuit.

FIG. 12 is a circuit diagram showing the internal construction of the reference voltage source 18 shown in FIG. 11. As shown in FIG. 12, an output voltage V30 from a band gap circuit 30 is applied to a positive input of an operational amplifier 60 through a resistor 59. The ground level output GND from the band gap circuit 30 is applied to a negative input of the operational amplifier 60 through resistors 61 and 62. The output of the operational amplifier 60 is fed back to the negative input thereof through a resistor 63 and is connected to the resistor 61 through a resistor 64.

The band gap circuit 30 includes a constant current source 71, resistors 72 to 74, NPN bipolar transistors 75, 76, and a diode 77. The constant current source 71, the resistor 72, and the diode 77 are connected between the power supply 13 and ground. A first end of the resistor 74 and the collector of the transistor 76 are connected to a node N1 between the constant current source 71 and the resistor 72. The base of the transistor 75 is connected to a node N2 between the resistor 72 and the anode of the diode 77. A first end of the resistor 73 is connected to a node N3 adjacent the cathode of the diode 77. The transistor 75 has a collector connected to a second end of the resistor 74, and an emitter connected to a second end of the resistor 73. The transistor 76 has a base connected to the second end of the resistor 74.

Voltage provided at the node N1 serves as the output voltage V30 of the band gap circuit 30. The output voltage V30 is determined by $$V30 = (R3/R2) \cdot VT \cdot \ln(I1/I2) + V_{BE} \quad (10)$$

where R1 to R3 are resistances of the resistors 72 to 74, respectively; VT is a threshold voltage of the diode 77; I1 is a current flowing in the resistor 72; I2 is a current flowing in the resistor 73; and $V_{BE}$ is a base-emitter voltage of the transistor 76.

For example, if R1: R2: R3=1: 1: 10, the output voltage V30 is 1.2 $V_{cc}$ (voltage of the power supply 13).

The reference voltage source 18 as above constructed can output a stable voltage VOUT in the form of the output of the operational amplifier 60 by negative feedback of the operational amplifier 60 receiving the output voltage V30 of the band gap circuit 30 at positive input.

<Operation>

In such a construction, the light intensity deterioration detecting circuit of the fourth preferred embodiment performs the output increase control and the output decrease control so that the detection current $I_{PD}$ equals the reference current I5 under control of the APC circuit 20 on the same principles as those of the first and second preferred embodiments.

In the light intensity deterioration detecting circuit of the fourth preferred embodiment, the output voltage V11 of the comparator 11 is determined by $$V11 = \alpha \cdot (R9 \cdot I_B - R10 \cdot I8)$$

where R9 is the resistance of the resistor 9, R10 is the resistance of the resistor 10, $I_B$ is the base current of the NPN bipolar transistor 6, and $\alpha$ is the amplification factor of the comparator (ideally ∞).

When the laser diode 1 is normal, $I_{PD}$=I5 is maintained under control of the APC circuit 20 and, consequently, the base current $I_B$ of the NPN bipolar transistor 6 is zero. Then the output voltage V11 of the comparator 11 is at the L level indicative of the normal state of the laser diode 1 from Equation (11).

When the current to light output characteristic of the laser diode 1 is abnormally deteriorated, the APC circuit 20 fails to perform the control and the state is stabilized when $I_{PD}$<I5. Then the base current In having the amount (I5−$I_{PD}$) flows which exceeds the micro reference current I8.

As a result, the output voltage V11 of the comparator 11 is at the H level indicative of the abnormal state of the laser diode 1 from Equation (11).

As above described, the light intensity deterioration detecting circuit of the fourth preferred embodiment detects whether the output voltage V11 of the comparator 11 is at the H level or the L level which is determined on the basis of the comparison result between the voltage at the first end of the resistor 9 carrying the base current In and the voltage at the first end of the resistor 10 carrying the reference current 18, thereby to verify whether light intensity deterioration occurs in the laser diode 1 or not.

Like the first and second preferred embodiments, since the errors of the output voltage V11 are produced depending upon the errors of the resistance ratio R9/R10 of the resistor 9 to the resistor 10. If relatively large errors are produced in the individual resistances, the resistance ratio errors may be reduced to a negligible level.

As a result, the light intensity deterioration detecting circuit of the fourth preferred embodiment correctly detects deterioration of the current to light output characteristic of the light emitter without an offset control.

Further, the construction of the light intensity deterioration detecting circuit of the fourth preferred embodiment allows the anode-cathode voltage of the photodiode 2 to be held constant independently of changes in the amount of the detection current $I_{PD}$.

In the light intensity deterioration detecting circuit of the first and second preferred embodiments, it is necessary to correctly control the reference current I5 and the reference current I8 in accordance with the characteristics of the laser diode 1 and the photodiode 2. However, the reference current I8 used in the light intensity deterioration detecting circuit of the fourth preferred embodiment, which is a current for detection of the presence/absence of the base current $I_B$, should be set to a micro level approximating zero without correctness required, and need not be changed depending on the types of the laser diode 1 and the photodiode 2. These effects are detailed below.

Table 1 shows set values of the reference current I5 and the reference current I8 depending on the types of the photodiode (PD) 2.

TABLE 1

| PD type | | PD1 | PD2 |
|---|---|---|---|
| 1st preferred | I5 | 2 · IPD1 + ΔIPD | 2 · IPD2 + ΔIPD |
| embodiment | I8 | IPD1 + ΔIPD | IPD2 + ΔIPD |
| 2nd preferred | I5 | IPD1/2 | IPD2/2 |
| embodiment | I8 | IPD1/2 + ΔIPD | IPD2/2 + ΔIPD |
| 4th preferred | I5 | IPD1 | IPD2 |
| embodiment | I8 | ΔIPD | ΔIPD |

In Table 1, IPD1 is the detection current $I_{PD}$ of a first type photodiode PD1 which flows when the laser diode 1 is normal, and IPD2 is the detection current $I_{PD}$ of a second type photodiode PD2 which flows when the laser diode 1 is normal. The photodiodes PD1 and PD2 correspond to the photodiode 2.

In the first preferred embodiment, the reference current I5 is required to be set to twice the amount of the detection current $I_{PD}$(IPD1, IPD2) where the laser diode 1 and the photodiode 2 are normal plus a deterioration allowance micro current ΔIPD for each type of photodiode, and the reference current I8 is required to be set to the detection current $1_{PD}$ where the laser diode 1 and the photodiode 2 are normal plus the deterioration allowance micro current ΔIPD.

In the second preferred embodiment, the reference current I5 is required to be set to half the amount of the detection current $I_{PD}$(IPD1, IPD2) where the laser diode 1 and the photodiode 2 are normal for each type of photodiode, and the reference current I8 is required to be set to half the amount of the detection current ΔIPD where the laser diode 1 and the photodiode 2 are normal plus the deterioration allowance micro current ΔIPD.

In the fourth preferred embodiment, however, the reference current I5 is required to be set to the detection current $I_{PD}$(IPD1, IPD2) where the laser diode 1 and the photodiode 2 are normal for each type of photodiode, and the reference current I8 is only required to be set to the deterioration allowance micro current ΔIPD at a micro level approximating zero independently of the types of the photodiode.

While the invention has been shown and described in detail, the foregoing description is in all aspects illustrative and not restrictive. It is therefore understood that numerous modifications and variations can be devised without departing from the scope of the invention.

What is claimed is:

1. A light intensity deterioration detecting circuit for detecting a light intensity deteriorated state in which a current to light output characteristic of light emitting means is deteriorated, comprising:

photoelectric conversion means receiving light from said light emitting means for supplying a detection current based on the intensity of the received light;

reference current supply means for supplying a predetermined reference current;

a first resistor having first and second ends and adapted so that said detection current flows from said first end to said second end thereof;

a second resistor, connected in parallel with the first resistor and connected to the first resistor at a common node, having first and second ends and adapted so that said predetermined reference current flows from said first end to said second end thereof, and voltage comparing means for comparing a first voltage drop generated by the flow of said detection current across said first resistor and a second voltage drop generated by the flow of said predetermined reference current across said second resistor with each other to provide an output signal on the basis of the comparison result.

2. A light intensity deterioration detecting circuit for detecting a light intensity deteriorated state in which a current to light output characteristic of light emitting means is deteriorated, comprising:

photoelectric conversion means receiving light from said light emitting means for supplying a detection current based on the intensity of the received light;

reference current supply means for supplying a predetermined reference current;

a first resistor having first and second ends and adapted so that said detection current flows from said first end to said second end thereof;

a second resistor having first and second ends and adapted so that said predetermined reference current flows from said first end to said second end thereof; and voltage comparing means for comparing a first voltage drop generated by the flow of said detection current across said first resistor and a second voltage drop generated by the flow of said predetermined reference current across said second resistor with each other to provide an output signal on the basis of the comparison result; wherein said voltage comparing means includes
a voltage comparator having a first input connected to the first end of said first resistor and a second input connected to the first end of said second resistor for outputting said output signal on the basis of a potential difference between the voltage provided at said first input and the voltage provided at said second input, and the second end of said first resistor and the second end of said second resistor are commonly connected.

3. The light intensity deterioration detecting circuit of claim 2, further comprising:

driving reference current supply means for supplying a driving reference current; and current amplifying means having an input connected to the second ends of said first and second resistors and an output connected to said driving reference current supply means, wherein said light emitting means emits light having a light output based on the amount of the output current of said current amplifying means subtracted from said driving reference current.

4. The light intensity deterioration detecting circuit of claim 3, wherein said driving reference current supply means includes:

a transistor having a first electrode connected to the output of said current amplifying means, a second electrode, and a control electrode;

an operational amplifier having a positive input receiving a constant voltage, a negative input, and an output connected to the control electrode of said transistor and fed back to the negative input; and a resistor having a first end connected to the second electrode of said transistor, and a second end connected to a predetermined power supply.

5. The light intensity deterioration detecting circuit of claim 4, wherein said light emitting means is a laser diode for outputting an erbium exciting laser light of an erbium fiber optic amplifier.

6. The light intensity deterioration detecting circuit of claim 5, wherein said photoelectric conversion means is a photodiode.

7. A light intensity deterioration detecting circuit for detecting a light intensity deteriorated state in which a current to light output characteristic of light emitting means is deteriorated, comprising:

photoelectric conversion means receiving light from said light emitting means for supplying a detection current based on the intensity of the received light;

divided current supply means receiving said detection current for dividing said detection current in a predetermined ratio to supply first and second divided detection currents;

reference current supply means for supplying a predetermined reference current;

a first resistor having first and second ends and adapted so that said first divided detection current flows from the first end to the second end thereof;

a second resistor having first and second ends and adapted so that said predetermined reference current flows from the first end to the second end thereof;

voltage comparing means for comparing a first voltage drop generated by the flow of said first divided detection current across said first resistor and a second voltage drop generated by the flow of said predetermined reference current across said second resistor with each other to provide an output signal on the basis of the comparison result;

driving reference current supply means for supplying a driving reference current; and current amplifying means having an input receiving said second divided detection current and an output connected to said driving reference current supply means, wherein said light emitting means emits light having a light output based on the amount of the output current of said current amplifying means subtracted from said driving reference current.

8. A light intensity deterioration detecting circuit for detecting a light intensity deteriorated state in which a current to light output characteristic of light emitting means is deteriorated, comprising:

photoelectric conversion means receiving light from said light emitting means for supplying a detection current based on the intensity of the received light;

reference current supply means for supplying a predetermined reference current; and current comparing means for comparing said detection current directly with said predetermined reference current in current amount to provide an output signal on the basis of the comparison result.

9. A light intensity deterioration detecting circuit for detecting a light intensity deteriorated state in which a current to light output characteristic of light emitting means is deteriorated, comprising:

photoelectric conversion means receiving light from said light emitting means for supplying a detection current based on the intensity of the received light;

reference current supply means for supplying a predetermined reference current;

divided current supply means receiving said detection current for dividing said detection current in a predetermined ratio to supply first and second divided detection currents;

current comparing means for comparing said detection current with said first divided detection current in current amount to provide an output signal on the basis of the comparison result;

driving reference current supply means for supplying a driving reference current; and current amplifying means having an input connected to said second divided detection current and an output connected to said driving reference current supply means, wherein said light emitting means emits light having a light output based on the amount of the output current of said current amplifying means subtracted from said driving reference current.

10. The light intensity deterioration detecting circuit of claim 9, wherein said current comparing means includes:

first and second transistors forming a current mirror circuit, each of said first and second transistors having a first electrode, a second electrode and a control electrode and carrying current from the first electrode thereof to the second electrode thereof, the first electrode of said first transistor being connected to the control electrode thereof and receiving said first divided detection current, the first electrode of said second transistor receiving said predetermined reference current, and said output signal is a potential provided at the first electrode of said second transistor.

11. A light intensity deterioration detecting circuit for detecting a light intensity deteriorated state in which a current to light output characteristic of light emitting means is deteriorated, comprising:

photoelectric conversion means receiving light from said light emitting means for supplying a first detection current based on the intensity of the received light;

first reference current supply means for supplying a first reference current having the amount of said first detection current assumed when said light emitting means is normal;

second reference current supply means for supplying a second reference current;

a transistor having a first electrode receiving said first detection current, a second electrode connected to said first reference current supply means, and a control electrode, said transistor being saturated to supply a control current from the control electrode to the second electrode when said first detection current is less than said first reference current;

detection current supply means for supplying a second detection current having an amount based on the amount of said control current;

a first resistor having first and second ends and adapted so that said second detection current flows from the first end to the second end thereof;

a second resistor having first and second ends and adapted so that said second reference current flows from the first end to the second end thereof; and voltage comparing means for comparing a first voltage drop generated by the flow of said second detection current across said first resistor and a second voltage drop generated by the flow of said second reference current across said second resistor with each other to provide an output signal on the basis of the comparison result.

12. The light intensity deterioration detecting circuit of claim 11, wherein said voltage comparing means includes:

a voltage comparator having a first input connected to the first end of said first resistor, and a second input connected to the first end of said second resistor for outputting said output signal on the basis of a potential difference between the voltage provided at said first input and the voltage provided at said second input, and the second end of said first resistor and the second end of said second resistor are commonly connected.

13. The light intensity deterioration detecting circuit of claim 12, further comprising:

driving reference current supply means for supplying a driving reference current; and current amplifying means having an input receiving said first detection current and an output connected to said driving reference current supply means, wherein said light emitting means emits light having a light output based on the amount of the output current of said current amplifying means subtracted from said driving reference current.

\* \* \* \* \*